(12) United States Patent
Ahn et al.

(10) Patent No.: US 12,352,984 B2
(45) Date of Patent: Jul. 8, 2025

(54) DISPLAY DEVICE INCLUDING A LENS ARRAY AND METHOD OF MANUFACTURING THE SAME

(71) Applicant: SAMSUNG DISPLAY CO., LTD., Yongin-si (KR)

(72) Inventors: Yi Joon Ahn, Seoul (KR); Beom Shik Kim, Yongin-si (KR); Jung Hun Noh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 2 days.

(21) Appl. No.: 18/381,354

(22) Filed: Oct. 18, 2023

(65) Prior Publication Data

US 2024/0049503 A1 Feb. 8, 2024

Related U.S. Application Data

(62) Division of application No. 17/137,892, filed on Dec. 30, 2020, now Pat. No. 11,825,688.

(30) Foreign Application Priority Data

Mar. 27, 2020 (KR) ........................ 10-2020-0037584

(51) Int. Cl.
*G02B 30/29* (2020.01)
*H10K 50/858* (2023.01)
(Continued)

(52) U.S. Cl.
CPC ............ *G02B 30/29* (2020.01); *H10K 50/858* (2023.02); *H10K 59/12* (2023.02); *H10K 59/38* (2023.02);
(Continued)

(58) Field of Classification Search
CPC ...... H10K 50/858; H10K 59/12; H10K 59/38; H10K 71/00; H10K 59/1201;
(Continued)

(56) References Cited

U.S. PATENT DOCUMENTS 5,871,653 A * 2/1999 Ling .................... G02B 3/0012
216/2
6,437,918 B1 * 8/2002 Hamanaka ....... B29D 11/00365
359/620
(Continued)

FOREIGN PATENT DOCUMENTS

JP 2014-170066 9/2014
KR 10-2016-0091498 8/2016
(Continued)

OTHER PUBLICATIONS

Office Action issued in corresponding application No. KR 10-2020-0037584 on Sep. 11, 2024.

*Primary Examiner* — Caleb E Henry
(74) *Attorney, Agent, or Firm* — F. CHAU & ASSOCIATES, LLC

(57) ABSTRACT

A display device includes: a first substrate; thin-film transistors disposed on a first surface of the first substrate; light emitting elements connected to corresponding ones of the thin-film transistors, respectively, and disposed on the thin-film transistors; and a lens array including lenses disposed on a second surface of the first substrate opposite to the first surface of the first substrate, wherein the light emitting elements emit light toward the first substrate.

8 Claims, 12 Drawing Sheets

(51) Int. Cl.
   *H10K 59/12*       (2023.01)
   *H10K 59/131*      (2023.01)
   *H10K 59/38*       (2023.01)
   *H10K 59/80*       (2023.01)
   *H10K 71/00*       (2023.01)
(52) U.S. Cl.
   CPC ........... *H10K 59/879* (2023.02); *H10K 71/00* (2023.02); *H10K 59/1201* (2023.02); *H10K 59/131* (2023.02)
(58) Field of Classification Search
   CPC ............. H10K 59/1213; H10K 59/123; H10K 59/1315; H10K 59/122; G02B 30/29; G02B 3/0006; G02F 1/133526; H05K 2201/10106
   See application file for complete search history.

(56) References Cited

U.S. PATENT DOCUMENTS

| | | | | |
|---|---|---|---|---|
| 7,511,419 | B2 * | 3/2009 | Takei | H10K 50/822 313/506 |
| 7,692,379 | B2 * | 4/2010 | Lim | H10K 50/858 313/506 |
| 7,695,757 | B2 * | 4/2010 | Onishi | H10K 50/85 427/226 |
| 7,780,493 | B2 * | 8/2010 | Choi | H10K 50/841 445/25 |
| 8,125,146 | B2 * | 2/2012 | Park | H10K 59/8722 313/512 |
| 8,408,775 | B1 | 4/2013 | Coleman | |
| 9,709,706 | B2 | 7/2017 | Kajiya et al. | |
| 10,717,670 | B2 | 7/2020 | Inoue et al. | |
| 10,923,684 | B2 | 2/2021 | Park et al. | |
| 11,552,275 | B2 | 1/2023 | Park et al. | |
| 2003/0081153 | A1 * | 5/2003 | Kobayashi | G02F 1/133512 349/95 |
| 2003/0142409 | A1 * | 7/2003 | Ohtsu | C25D 5/024 359/619 |
| 2003/0228759 | A1 * | 12/2003 | Uehara | G02B 3/0056 438/689 |
| 2004/0012734 | A1 * | 1/2004 | Yamanaka | G02F 1/133526 349/95 |
| 2004/0099633 | A1 * | 5/2004 | Okada | G03F 7/0007 216/26 |
| 2004/0114111 | A1 * | 6/2004 | Watanabe | G02F 1/133504 353/31 |
| 2004/0189185 | A1 * | 9/2004 | Yotsuya | H10K 59/879 313/112 |
| 2006/0175965 | A1 * | 8/2006 | Lim | H10K 50/858 313/506 |
| 2007/0013648 | A1 * | 1/2007 | Yamaguchi | G02F 1/133555 345/102 |
| 2007/0267629 | A1 * | 11/2007 | Kwak | B23K 26/0676 257/40 |
| 2009/0009703 | A1 * | 1/2009 | Tamaki | G02F 1/133788 349/123 |
| 2009/0185287 | A1 * | 7/2009 | Sowa | G02B 26/10 359/708 |
| 2010/0099323 | A1 * | 4/2010 | Zu | H10K 59/8722 445/25 |
| 2011/0278548 | A1 * | 11/2011 | Takezoe | H10K 50/858 362/326 |
| 2014/0050933 | A1 * | 2/2014 | Kim | H10K 50/80 427/407.1 |
| 2015/0266313 | A1 * | 9/2015 | Kubota | G02B 5/003 427/559 |
| 2018/0124384 | A1 * | 5/2018 | Huh | H10K 59/00 |
| 2020/0075699 | A1 * | 3/2020 | Kim | H10K 59/80515 |
| 2021/0305541 | A1 | 9/2021 | Ahn et al. | |

FOREIGN PATENT DOCUMENTS

| | | |
|---|---|---|
| KR | 10-2017-0051775 A | 5/2017 |
| KR | 10-2017-0115595 A | 10/2017 |
| KR | 10-2018-0066475 A | 6/2018 |
| KR | 10-2019-0025129 | 3/2019 |
| KR | 10-2019-0098884 | 8/2019 |

* cited by examiner

DISPLAY DEVICE INCLUDING A LENS ARRAY AND METHOD OF MANUFACTURING THE SAME

CROSS-REFERENCE TO RELATED APPLICATIONS

This application is a divisional of U.S. patent application Ser. No. 17/137,892 filed on Dec. 30, 2020, which claims priority under 35 U.S.C. § 119 to Korean Patent Application No. 10-2020-0037584 filed on Mar. 27, 2020, the disclosures of which are incorporated by reference herein in their entireties.

TECHNICAL FIELD

Exemplary embodiments of the present inventive concept relate to a display device and a method of manufacturing the same, and more particularly, to a display device including a lens array and a method of manufacturing the display device.

DISCUSSION OF THE RELATED ART

As the information society develops, the demand for display devices for displaying images is increasing in various forms. Accordingly, various display devices such as liquid crystal displays (LCDs), plasma display panels (PDPs), and organic light emitting displays (OLED) are being utilized.

A stereoscopic image display device and a viewing angle control display device, each dividing an image being displayed by the display device and displaying the divided image in a space in front of the display device by using a lens array, have been under development. Typically, the stereoscopic image display device displays a left-eye image and a right-eye image separately to provide a three-dimensional (3D) effect due to binocular parallax. The viewing angle control display device generally displays a first viewing angle image and a second viewing angle image separately to provide different images to users located at different viewing angles from the display device. In addition, in each of the stereoscopic image display device and the viewing angle control display device, the lens array may be attached to the display panel.

SUMMARY

According to an exemplary embodiment of the present inventive concept, a display device includes: a first substrate; thin-film transistors disposed on a first surface of the first substrate; light emitting elements connected to corresponding ones of the thin-film transistors, respectively, and disposed on the thin-film transistors; and a lens array including lenses disposed on a second surface of the first substrate opposite to the first surface of the first substrate, wherein the light emitting elements emit light toward the first substrate.

In an exemplary embodiment of the present inventive concept, the lens array contacts the second surface of the first substrate.

In an exemplary embodiment of the present inventive concept, the first substrate includes a polymer resin.

In an exemplary embodiment of the present inventive concept, the lens array includes glass.

In an exemplary embodiment of the present inventive concept, each of the light emitting elements includes: a first electrode connected to a thin-film transistor of the thin-film transistors; a light emitting layer disposed on the first electrode; and a second electrode disposed on the light emitting layer, wherein the first electrode includes a conductive material that transmits light, and the second electrode includes a conductive material that reflects light.

In an exemplary embodiment of the present inventive concept, the display device farther includes a second substrate disposed on the second electrode.

In an exemplary embodiment of the present inventive concept, each of the lenses has a half-cylindrical shape or a hemispherical shape.

In an exemplary embodiment of the present inventive concept, each of the lenses curves outwards from the second surface of the first substrate.

According to an exemplary embodiment of the present inventive concept, a method of manufacturing a display device includes: irradiating a laser to a predetermined position of a lens array substrate; forming a first substrate on a first surface of the lens array substrate; forming thin-film transistors and light emitting elements on a first surface of the first substrate; and forming a lens array by etching a second surface opposite to the first surface of the lens array substrate, wherein the lens array includes lenses.

In an exemplary embodiment of the present inventive concept, physical properties of the lens array substrate at the predetermined position are different from physical properties of the lens array substrate in an area of the lens array substrate other than the predetermined position.

In an exemplary embodiment of the present inventive concept, the lens array substrate is made of glass.

In an exemplary embodiment of the present inventive concept, the lens array substrate includes a SiO bond at the predetermined position and includes a SiO2 bond in the area of the lens array substrate other than the predetermined position.

In an exemplary embodiment of the present inventive concept, the irradiating of the laser to the lens array substrate includes irradiating the laser along first lens lines extending in a first direction.

In an exemplary embodiment of the present inventive concept, a gap between adjacent first lens lines in a second direction intersecting the first direction is equal to a pitch of each lens in the second direction.

In an exemplary embodiment of the present inventive concept, at least one of the first lens lines corresponds to a boundary between adjacent lenses.

In an exemplary embodiment of the present inventive concept, each of the lenses is a lenticular lens extending in the first direction.

In an exemplary embodiment of the present inventive concept, the irradiating of the laser to the lens array substrate includes irradiating the laser along first lens lines having a circular or elliptical shape.

In an exemplary embodiment of the present inventive concept, each of the lenses has a half-cylindrical shape or a hemispherical shape.

In an exemplary embodiment of the present inventive concept, the forming of the lens array by etching the second surface of the lens array substrate includes wet-etching the second surface of the lens array substrate by using hydrogen fluoride (HF).

In an exemplary embodiment of the present inventive concept, the lens array contacts a second surface of the first substrate.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
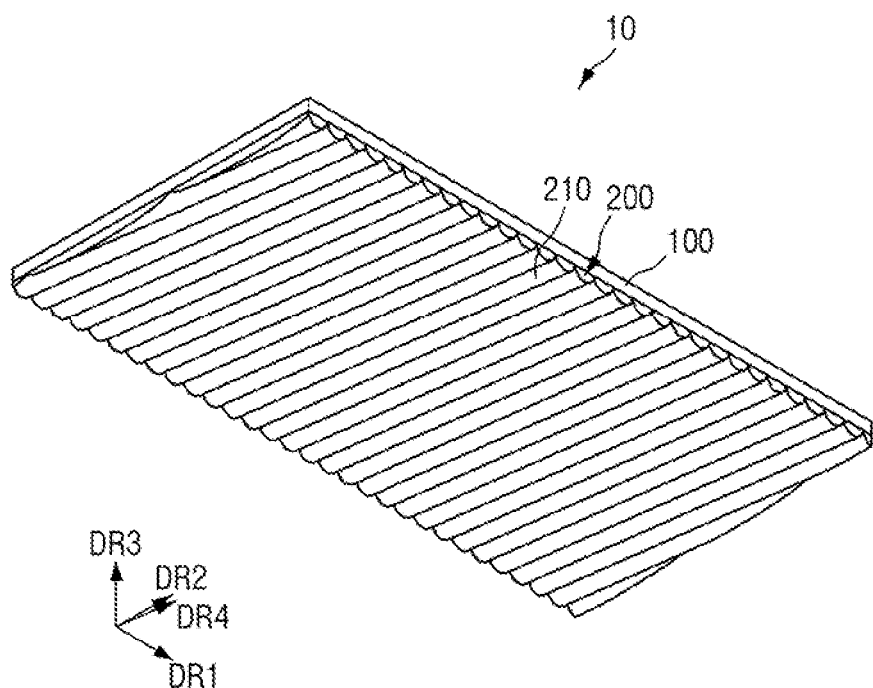
FIG. 1 is a perspective view of a display device according to an exemplary embodiment of the present inventive concept.

Exemplary embodiments of the present inventive concept will be described more fully hereinafter with reference to the accompanying drawings. Like reference numerals may refer to like elements throughout the accompanying drawings, and thus, their descriptions may be omitted.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present therebetween. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects of each exemplary embodiment are applicable to other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below", "beneath" and "under" can encompass both an orientation of above and below.

FIG. 1 is a perspective view of a display device 10 according to an exemplary embodiment of the present inventive concept.

Referring to FIG. 1, the display device 10 according to the present embodiment may include a display panel 100 and a lens array 200.

The display device 10 may be a stereoscopic image display device or a viewing angle control display device that divides an image displayed on the display panel 100 and displays the divided image in a space in front of the display device 10 by using the lens array 200. For example, when the display device 10 is a stereoscopic image display device, a left-eye image and a right-eye image may be displayed separately in the space in front of the display device 10 to provide a three-dimensional (3D) effect due to binocular parallax. When the display device 10 is a viewing angle control display device, a first viewing angle image and a second viewing angle image may be displayed separately in the space in front of the display device 10 to provide different images to users located at different viewing angles from the display device 10.

The display panel 100 may be a light emitting display panel including light emitting elements. For example, the display panel 100 may be an organic light emitting display panel using organic light emitting diodes that include, for example, organic light emitting layers, a micro light emitting diode display panel using micro light emitting diodes, a quantum dot light emitting display panel using quantum dot light emitting diodes that include quantum dot light emitting layers, or an inorganic light emitting display panel using inorganic light emitting elements that include inorganic semiconductors. A case where the display panel 100 is an organic light emitting display panel will be mainly described below.

The display panel 100 may have a planar shape similar to, for example, a quadrangle shape. The display panel 100 may have long sides in a first direction DR1 and short sides in a second direction DR2. For example, each corner where a long side extending in the first direction DR1 meets a short side extending in the second direction DR2 may be rounded with a predetermined curvature or may be right-angled. The planar shape of the display panel 100 is not limited to the quadrangular shape but may also be another polygonal shape, a circular shape, or an elliptical shape.

To display an image, the display panel 100 may include data lines, scan lines, and a plurality of subpixels connected to the data lines and the scan lines. Each of the subpixels may be connected to at least one scan line and at least one data line. Each of the subpixels may include thin-film transistors, such as a (hiving transistor and at least one switching transistor, and a light emitting element. Each of the subpixels may receive a data voltage through a data line in response to a scan signal transmitted from a scan line and may emit light by supplying a driving current to the light emitting element according to the data voltage applied to a gate electrode of the driving transistor.

The lens array 200 may be disposed on a surface of the display panel 100, For example, the lens array 200 may directly contact the surface of the display panel 100. For example, the lens array 200 may be fixed to the surface of the display panel 100 without a separate adhesive member.

Since the lens array 200 is formed directly on the surface of the display panel 100, there is no need to align and attach the lens array 200 to the display panel 100. The structure in which the lens array 200 directly contacts the surface of the display panel 100 will be described later with reference to FIGS. 9 and 10.

For example, the lens array 200 may be made of glass. However, the present inventive concept is not limited thereto; for example, the lens array 200 may include a polycarbonate material. The lens array 200 may include a plurality of lenses 210, Each of the lenses 210 may be a lenticular lens extending in a fourth direction DR4 as illustrated in FIG. 1. In this case, each of the lenses 210 may be a half-cylindrical lens extending in the fourth direction DR4, but the present inventive concept is not limited thereto. Each of the lenses 210 may be a Fresnel lens. In addition, each of the lenses 210 may be a slanted lens inclined at a predetermined angle with respect to the first direction DR1. The lenses 210 may be arranged in a fifth direction DR5 intersecting the fourth direction DR4.

Figure 2:
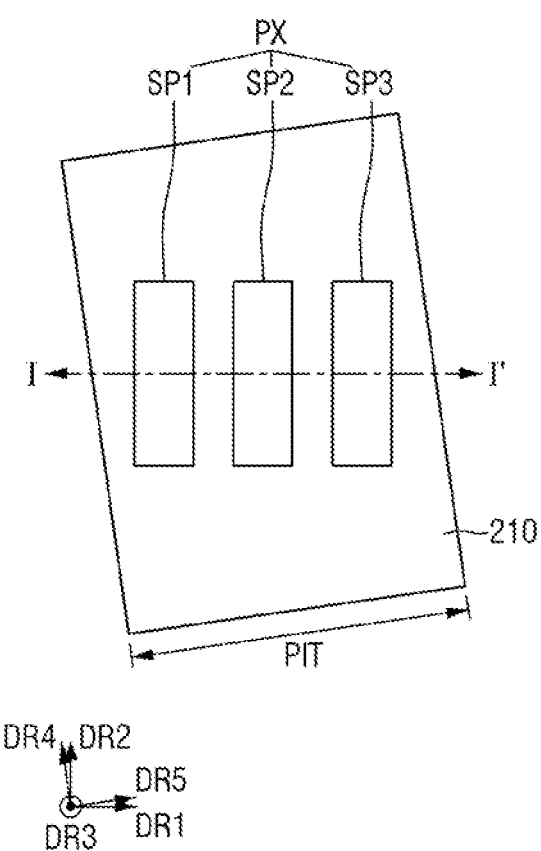
FIGS. 2 and 3 are views for illustrating a method of realizing a stereoscopic image and a viewing angle control image of the display device according to an exemplary embodiment of the present inventive concept.
Figure 3:
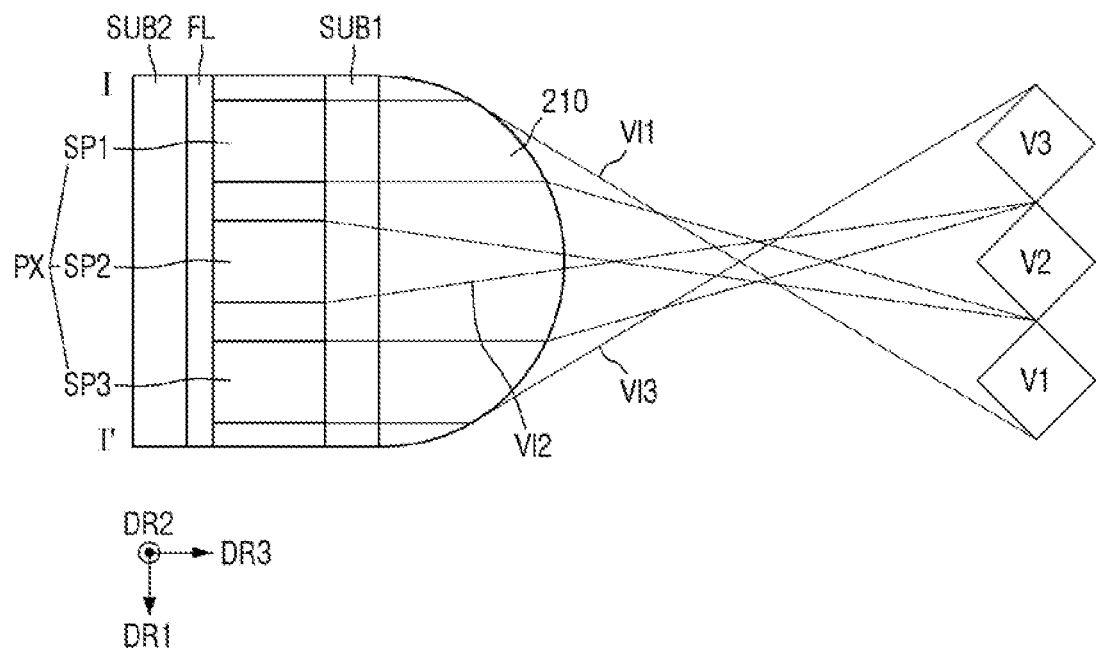

FIGS. 2 and 3 are views illustrating a method of realizing a stereoscopic image and a viewing angle control image of the display device 10 according to an exemplary embodiment of the present inventive concept.

FIG. 2 illustrates a pixel PX, which includes subpixels SP1 through SP3 of the display panel 100, and a lens 210 as seen in a plan view, and FIG. 3 illustrates a cross-section of the display panel 100 and the lens 210 taken along I-I' of FIG. 2. In FIG. 2, one pixel PX of the display panel 100 and one lens 210 are illustrated for ease of description. In FIG. 3, one pixel PX of the display panel 100, one lens 210, a first substrate SUB1, a filler FL, and a second substrate SUB2 are illustrated for ease of description.

Referring to FIGS. 2 and 3, the display panel 100 may include the first substrate SUB1, a plurality of pixels PX, the filler FL, and the second substrate SUB2.

The first substrate SUB1 may include, for example, an organic polymer material such as polyethylene, polyimide, polycarbonate, polysulfone, polyacrylate, polystyrene, polyvinyl chloride, polyvinyl alcohol, polynorbornene, or polyester.

The pixels PX may be disposed on a first surface of the first substrate SUB1. Each of the pixels PX may include a first subpixel SP1, a second subpixel SP2, and a third subpixel SP3. Each of the pixels PX may be a group of subpixels SP1 through SP3 for expressing a white gray level, Each of the subpixels SP1 through SP3 may be a minimum unit capable of expressing a gray level.

The first subpixel SP1 may emit light of a first color. The second subpixel SP2 may emit light of a second color, and the third subpixel SP3 may emit light of a third color. For example, the first color may be red, the second color may be green, and the third color may be blue, but the present inventive concept is not limited thereto.

Each of the first subpixel SP1, the second subpixel SP2, and the third subpixel SP3 may have a polygonal shape. For example, each of the first subpixel SP1, the second subpixel SP2, and the third subpixel SP3 may have a rectangular planar shape having short sides in the first direction DR1 and long sides in the second direction DR2. In each pixel PX, the first subpixel SP1, the second subpixel SP2, and the third subpixel SP3 may be arranged in the first direction DR1.

The second substrate SUB2 may be disposed on the pixels PX. For example, the second substrate SUB2 may be made of glass or an organic polymer resin such as polyethylene, polyimide, polycarbonate, polysulfone, polyacrylate, polystyrene, polyvinyl chloride, polyvinyl alcohol, polynorbornene, or polyester.

The filler FL may be disposed between the pixels PX and the second substrate SUB2 The filler FL may be made of a material having a buffer function. For example, the filler FL may be an organic layer such as acryl resin, epoxy resin, phenolic resin, polyamide resin, or polyimide resin.

The lens 210 may be disposed on a second surface opposite the first surface of the first substrate SUB1. The lens 210 may directly contact the second surface of the first substrate SUB1. For example, the lens 210 may be fixed to the second surface of the first substrate SUB1 without a separate adhesive member. For example, the lens 210 may be directly formed on the second surface of the first substrate SUB1. The lens 210 formed on the second surface of the first substrate SUB1 will be described later with reference to FIGS. 7 through 10.

The lens 210 may extend in the fourth direction DR4. The lens 210 may be inclined at a predetermined angle with respect to the long sides of each of the subpixels SP1 through SP3. For example, the lens 210 may be inclined at a predetermined angle with respect to the second direction DR2. As another example, the lens 210 may be at a tilt with respect to the long sides of each of the subpixels SP1 and SP3.

Since lenses 210 are arranged in the first direction DR1, a pitch PIT of the lens 210 may be a length of the lens 210 in the fifth direction DR5 crossing the first direction DR1. In FIGS. 2 and 3, for ease of description, three subpixels SP1 through SP3 are disposed in the first direction DR1 (e.g., an X-axis direction) within the pitch PIT of the lens 210, but the present inventive concept is not limited thereto.

The first subpixel SP1 may be disposed adjacent to a first side of the lens 210. The second subpixel SP2 may be disposed in the middle of the lens 210, and the third subpixel SP3 may be disposed adjacent to a second side of the lens 210. For example, the second subpixel SP2 may be disposed between the first and third subpixels SP1 and SP3. For example, as illustrated in FIGS. 2 and 3, the first side of the lens 210 may indicate a left side of the lens 210, and the second side of the lens 210 may indicate a right side of the lens 210.

In this case, as illustrated in FIG. 3, a first view image VI1 displayed by the first subpixel SP1 may be refracted by the lens 210 and provided to a first view area V1 disposed in front of the second side of the lens 210 of the display device 10. A second view image VI2 displayed by the second subpixel SP2 may be hardly refracted by the lens 210 and may be provided to a second view area V2 disposed in front of the middle of the lens 210 of the display device 10. A third view image VI3 displayed by the third subpixel SP3 may be refracted by the lens 210 and provided to a third view area V3 disposed in front of the first side of the lens 210 of the display device 10, For example, the second view area V2 may be between the first view area V1 and the third view V3. As an additional example, the second view image V2 may be refracted less than the first view image VI1 and/or the third view image VI3. For example, as illustrated in FIG. 3, the first view image VI1 displayed by the first subpixel SP1, the second view image VI2 displayed by the second subpixel SP2, and the third view image VI3 displayed by the third subpixel SP3 may be displayed in separate spaces in front of the display device 10.

The first view image VI1, the second view image VI2, and the third view image VI3 may be images generated in consideration of binocular parallax. When a user's left eye and right eye are located in different view areas among the first view area V1, the second view area V2 and the third view area V3, the user may experience a 3D effect due to binocular parallax.

In addition, the first view image VI1, the second view image VI2, and the third view image VI3 may be different images. For example, when the display device 10 is applied to a vehicle display, the first view image VI1 may be a navigation image, the second view image VI2 may be an image showing vehicle information, and the third view image VI3 may be an entertainment image showing a movie. In this case, a user located in the first view area V1 may view only the navigation image. Further, a user located in the second view area V2 may view only the image showing the vehicle information, and a user located in the third view area V3 may view only the entertainment image. For example, the display device 10 may show different images to users located at different viewing angles.

In FIGS. 2 and 3, for ease of description, three view images VI1 through VI3 are provided to three view areas V1 through V3 by three subpixels SP1 through SP3 disposed within the pitch PIT of the lens 210, but the present inventive concept is not limited thereto. For example, the number of subpixels disposed within the pitch PIT of the lens 210, the number of view images, and the number of view areas may be determined according to the size of the display device 10, of which a stereoscopic image and a viewing angle image will be provided by the display device 10, and the like.

Figure 4:
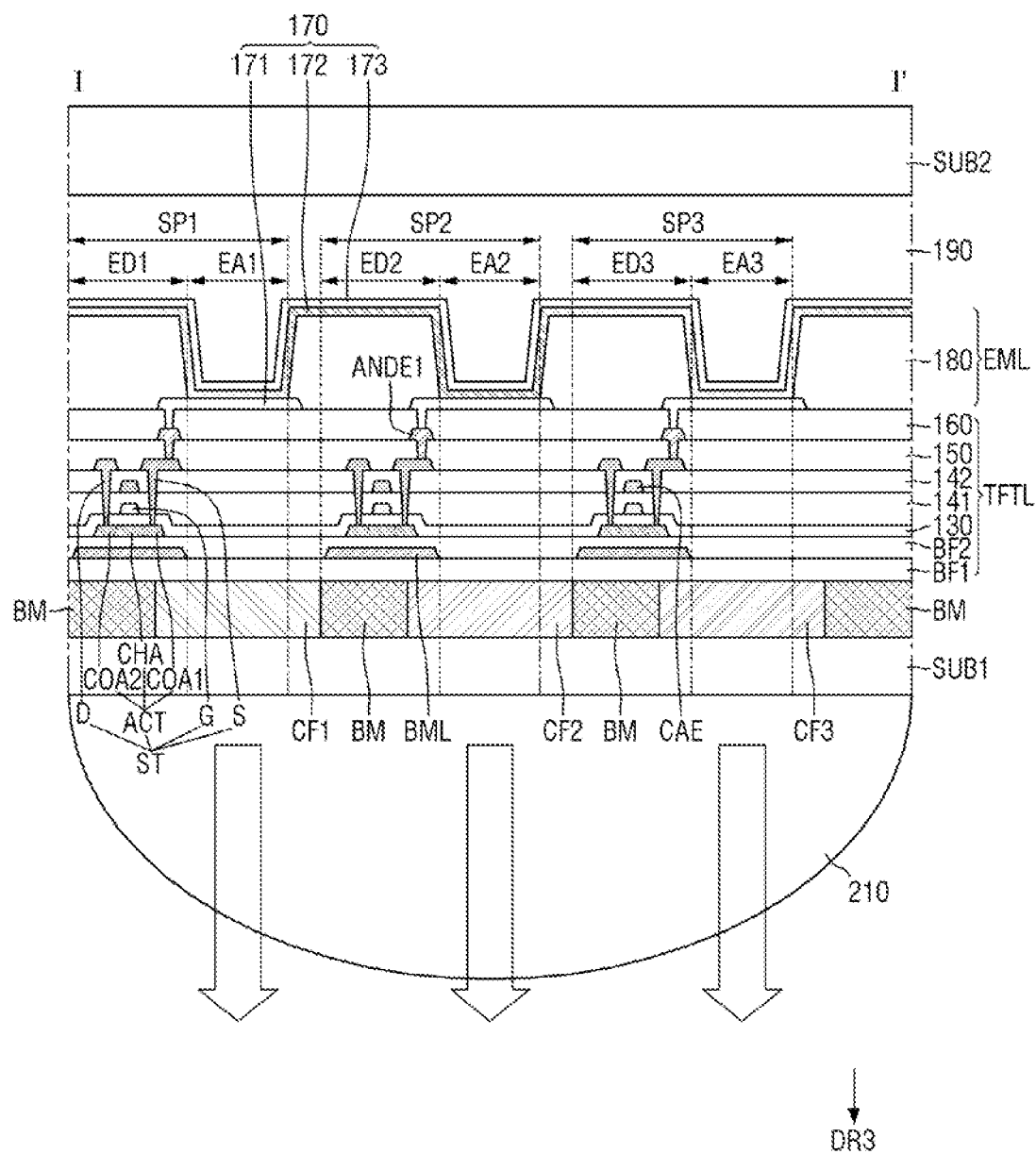
FIG. 4 is a cross-sectional view of a display panel of FIG. 1.

FIG. 4 is a cross-sectional view of the display panel 100 of FIG. 1.

Referring to FIG. 4, the display panel 100 may include the first substrate SUB1, the second substrate SUB2, and a pixel array layer. The pixel array layer may include a thin-film transistor layer TFTL and a light emitting element layer EML.

Color filters CF1 through CF3 and a black matrix BM may be disposed on a surface of the first substrate SUB1 which faces the second substrate SUB2.

A first color filter CF1 may be a first color light transmitting filter that transmits light of a first color. A second color filter CF2 may be a second color light transmitting filter that transmits light of a second color, and a third color filter CF3 may be a third color light transmitting filter that transmits light of a third color. For example, the first color may be red, the second color may be green, and the third color may be blue. For example, a peak wavelength range of red light transmitted through the first color filter CF1 may be about 620 nm to about 750 nm. In addition, a peak wavelength range of green light transmitted through the second color filter CF2 may be about 500 nm to about 570 nm, and a peak wavelength range of blue light transmitted through the third color filter CF3 may be about 450 nm to about 490 nm.

The first color filter CF1 may overlap a first emission area EA1 of the first subpixel SP1 in a third direction DR3, and light emitted from the first emission area EA1 may be output as light of the first color according to the first color filter CF1. The second color filter CF2 may overlap a second emission area EA2 of the second subpixel SP2 in the third direction DR3, and light emitted from the second emission area EA2 may be output as light of the second color according to the second color filter CF2. The third color filter CF3 may overlap a third emission area EA3 of the third subpixel SP3 in the third direction DR3, and light emitted from the third emission area EA3 may be output as light of the third color according to the third color filter CF3.

The black matrix BM may include a material that can block light. For example, the black matrix BM may be an organic layer, including a black dye or pigment, or a metal layer including an opaque metal material such as chromium (Cr). The black matrix BM may be disposed between two color filters adjacent to each other. The black matrix BM may prevent light of any one subpixel from travelling to a neighboring color filter overlapping a neighboring subpixel in the third direction DR3.

Although the color filters CF1 through CF3 and the black matrix BM are disposed between the first substrate SUB1 and a first buffer layer BF1 in FIG. 4, the position of the color filters CF1 through CF3 and the black matrix BM is not limited thereto. For example, the color filters CF1 through CF3 and the black matrix BM may be disposed between a first organic layer 150 and a second organic layer 160 or may be disposed instead of the first organic layer 150.

The first buffer layer BF1 may be disposed on the first substrate SUB1, and a second buffer layer BF2 may be disposed on the first buffer layer BF1. The first and second buffer layers BF1 and BF2 may protect thin-film transistors ST of the thin-film transistor layer TFTL and a light emitting layer 172 of the light emitting element layer EML from moisture introduced through the first substrate SUB1 which may be vulnerable to moisture penetration. Each of the first buffer layer BF1 and the second buffer layer BF2 may be a multilayer in which one or more inorganic layers, including, for example, a silicon nitride layer, a silicon oxynitride layer, a silicon oxide layer, a titanium oxide layer, and/or an aluminum oxide layer, are alternately stacked. However, the present inventive concept is not limited thereto. For example, each of the first buffer layer BF1 and the second buffer layer BF2 may be a single layer. At least any one of the first and second buffer layers BF1 and BF2 can be omitted.

First light blocking layers BML may be disposed on the first buffer layer BF1. Each of the first light blocking layers BML may be a single layer or a multilayer including at least one of molybdenum (Mo), aluminum (Al), chromium (Cr), gold (Au), titanium (Ti), nickel (Ni), neodymium (Ne), copper (Cu), and alloys of the same. In addition, each of the first light blocking layers BML may be an organic layer including a black pigment.

An active layer ACT of each thin-film transistor ST may be disposed on the second buffer layer BF2. The active layer ACT may include, for example, polycrystalline silicon, monocrystalline silicon, low-temperature polycrystalline silicon, amorphous silicon, or an oxide semiconductor. When the active layer ACT includes polycrystalline silicon or an oxide semiconductor material, an ion-doped region of the active layer ACT may be a conductive region having conductivity.

Each of the active layers ACT may overlap a corresponding first light blocking layers BML in the third direction DR3 (Z-axis direction). Since light incident through the first substrate SUB1 may be blocked by the first light blocking layers BML, it is possible to prevent leakage current from flowing through the active layers ACT due to the light incident through the first substrate SUB1.

A gate insulating layer 130 may be formed on the active layer ACT of each thin-film transistor ST. The gate insulating layer 130 may be an inorganic layer, for example, a silicon nitride layer, a silicon oxynitride layer, a silicon oxide layer, a titanium oxide layer, and/or an aluminum oxide layer.

A gate electrode G of each thin-film transistor ST may be disposed on the gate insulating layer 130. The gate electrode G of each thin-film transistor ST may overlap the active layer ACT in the third direction DR3 (Z-axis direction). A part of the active layer ACT overlapped by the gate electrode G in the third direction DR3 (Z-axis direction) may be a channel region CHA. The gate electrode G may be a single layer or a multilayer including at least one of molybdenum (Mo), aluminum (Al), chromium (Cr), gold (Au), titanium (Ti), nickel (Ni), neodymium (Ne), copper (Cu), and alloys of the same.

A first interlayer insulating film 141 may be formed on the gate electrodes G. The first interlayer insulating film 141 may be an inorganic layer, for example, a silicon nitride layer, a silicon oxynitride layer, a silicon oxide layer, a titanium oxide layer, or an aluminum oxide layer. The first interlayer insulating film 141 may include a plurality of inorganic layers.

Capacitor electrodes CAE may be disposed on the first interlayer insulating film 141. The capacitor electrodes CAE may respectively overlap the gate electrodes G in the third direction DR3 (Z-axis direction). Each of the capacitor electrodes CAE may overlap a first electrode, which may correspond to the gate electrode G, to form a sensing capacitor. Each of the capacitor electrodes CAE may be a single layer or a multilayer including at least one of molybdenum (Mo), aluminum (Al), chromium (Cr), gold (Au), titanium (Ti), nickel (Ni), neodymium (Ne), copper (Cu), and alloys of the same.

A second interlayer insulating film 142 may be disposed on the capacitor electrodes CAE. The second interlayer insulating film 142 may be an inorganic layer, for example, a silicon nitride layer, a silicon oxynitride layer, a silicon oxide layer, a titanium oxide layer, and/or an aluminum oxide layer. The second interlayer insulating film 142 may include a plurality of inorganic layers.

A first electrode S and a second electrode of each thin-film transistor ST may be disposed on the second interlayer insulating film 142. Each of the first electrode S and the second electrode D may be a single layer or a multilayer including at least one of molybdenum (Mo), aluminum (Al), chromium (Cr), gold (Au), titanium (Ti), nickel (Ni), neodymium (Ne), copper (Cu), and alloys of the same.

The first electrode S of each thin-film transistor ST may be connected to a first conductive region COAT disposed on a side of the channel region CHA of the active layer ACT through a contact hole penetrating the gate insulating layer 130, the first interlayer insulating film 141 and the second interlayer insulating film 142. The second electrode D of each thin-film transistor ST may be connected to a second conductive region COA2 disposed on the other side of the channel region CHA of the active layer ACT through a contact hole penetrating the gate insulating layer 130, the first interlayer insulating film 141 and the second interlayer insulating film 142.

The first organic layer 150 may be disposed on the first electrodes S and the second electrodes D to flatten steps due to the thin-film transistors ST. The first organic layer 150 may be an organic layer such as acryl resin, epoxy resin, phenolic resin, polyamide resin, or polyimide resin.

First connection electrodes ANDE1 may be disposed on the first organic layer 150. Each of the first connection electrodes ANDE1 may be respectively connected to the first electrodes S of the thin-film transistors ST through corresponding contact holes penetrating the first organic layer 150, Each of the first connection electrodes ANDE1 may be a single layer or a multilayer including at least one of molybdenum (Mo), aluminum (Al), chromium (Cr), gold (Au), titanium (Ti), nickel (Ni), neodymium (Ne), copper (Cu), and alloys of the same.

The second organic layer 160 may be disposed on the first connection electrodes ANDE1. The second organic layer 160 may be an organic layer such as acryl resin, epoxy resin, phenolic resin, polyamide resin, or polyimide resin.

Although each thin-film transistor ST is illustrated in FIG. 4 as a top-gate type in which the gate electrode G is located above the active layer ACT, it should be noted that the present inventive concept is not limited thereto. For example, each thin-film transistor ST may be formed as a bottom-gate type, in which the gate electrode G is located under the active layer ACT, or as a double-gate type, in which the gate electrode G is located both above and under the active layer ACT.

The light emitting element layer EML is disposed on the thin-film transistor layer TFTL. The light emitting element layer EML may include light emitting elements 170 and a bank 180. Each of the light emitting elements 170 may include a first light emitting electrode 171, the light emitting layer 172, and a second light emitting electrode 173.

The subpixels SP1 through SP3 may include the emission areas EM through EA3 and emission drivers ED1 through ED3, respectively. The first subpixel SP1 may include the first emission area EA1 and a first emission driver ED1. The second subpixel SP2 may include the second emission area EA2 and a second emission driver ED2. The third subpixel SP3 may include the third emission area EA3 and a third emission driver ED3.

Each of the emission drivers ED1 through ED3 may include at least one thin-film transistor ST. Each of the emission areas EA1 through EA3 is an area in which the first light emitting electrode 171, the light emitting layer 172 and the second light emitting electrode 173 are sequentially stacked so that holes from the first light emitting electrode 171 and electrons from the second light emitting electrode 173 combine together in the light emitting layer 172 to emit light. In this case, the first light emitting electrode 171 may be an anode, and the second light emitting electrode 173 may be a cathode.

The first light emitting electrodes 171 may be formed on the second organic layer 160. Each of the first light emitting electrodes 171 may be connected to a corresponding first connection electrode ANDE1 through a corresponding contact hole penetrating the second organic layer 160.

In a bottom emission structure in which light is emitted in a direction from each light emitting layer 172 toward each first light emitting electrode 171, each first light emitting electrode 171 may be made of, for example, a transparent conductive material (TCO) capable of transmitting light, such as indium tin oxide (ITO) or indium zinc oxide (IZO), or a semi-transmissive conductive material such as magnesium (Mg), silver (Ag) or an alloy of Mg and Ag. When each first light emitting electrode 171 is made of a semi-transmissive conductive material, light output efficiency may be increased by a microcavity.

The bank 180 may form the emission areas EA1 through EA3 of display pixels. To this end, the bank 180 may be formed on the second organic layer 160 to expose a part, of each first light emitting electrode 171. The bank 180 may cover edges of each first light emitting electrode 171. The first light emitting electrode 171 may be disposed in a contact hole penetrating the second organic layer 160. The bank 180 may be an organic layer such as acryl resin, epoxy resin, phenolic resin, polyimide resin, or polyimide resin.

The light emitting layer 172 is formed on the first light emitting electrodes 171 and the bank 180. The light emitting layer 172 may be a common layer common to the subpixels SP1 through SP3. The light emitting layer 172 may include an organic material to emit light of a predetermined color. For example, the light emitting layer 172 may include a hole transporting layer, an organic material layer, and an electron transporting layer. The organic material layer may include a host and a dopant. The organic material layer may include a material that emits predetermined light and may be formed using a phosphorescent material or a fluorescent material.

The second light emitting electrode 173 is formed on the light emitting layer 172. The second light emitting electrode 173 may be formed to cover the light emitting layer 172. The second light emitting electrode 173 may be a common layer common to the subpixels SP1 through SP3. For example, a capping layer may be formed on the second light emitting electrode 173.

In the bottom emission structure, the second light emitting electrode 173 may include a conductive material that reflects light. For example, the second light emitting electrode 173 may be a single layer of, for example, molybdenum (Mo), titanium (Ti), copper (Cu) or aluminum (Al) or, for example, may have a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide to increase reflectivity. The APC alloy is an alloy of silver (Ag), palladium (Pd), and copper (Cu).

Since the first light emitting electrodes 171 are made of a transparent conductive material (TCO) capable of transmitting light or a semi-transmissive conductive material and the second light emitting electrode 173 is made of an opaque metal material having high reflectivity, light of the light emitting layer 172 may be output toward the first substrate SUB1. For example, each of the light emitting elements 170 may have the bottom emission structure that emits light downward.

An encapsulation layer 190 is formed on the light emitting element layer EML. The encapsulation layer 190 may prevent oxygen or moisture from penetrating into the light emitting layer 172 and the second light emitting electrode 173. For example, the encapsulation layer 190 may include at least one inorganic layer. The inorganic layer may be made of, for example, silicon nitride, aluminum nitride, zirconium nitride, titanium nitride, hafnium nitride, tantalum nitride, silicon oxide, aluminum oxide, and/or titanium oxide. In addition, the encapsulation layer 190 may further include at least one organic layer. The organic layer may be formed to a sufficient thickness to prevent particles from penetrating through the encapsulation layer 190 and then entering the light emitting layer 172 and the second light emitting electrode 173. The organic layer may include at least one of epoxy, acrylate, and/or urethane acrylate.

The filler FL may be disposed between the encapsulation layer 190 and the second substrate SUB2. The filler FL may be made of a material having a buffer function. For example, the filler FL may be an organic layer such as acryl resin, epoxy resin, phenolic resin, polyamide resin, or polyimide resin.

In addition, a sealing material for bonding the first substrate SUB1 and the second substrate SUB2 may be disposed between the first substrate SUB1 and the second substrate SUB2. The filler FL may be surrounded by the sealing material when seen in a plan view. The sealing material may be, for example, a glass frit or a sealant.

Figure 5:
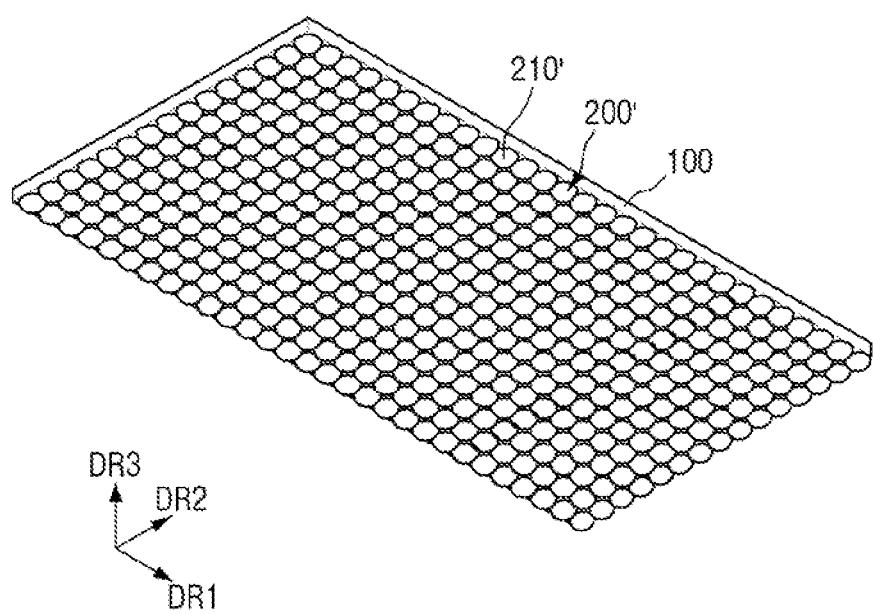
FIG. 5 is a perspective view of a display device according to an exemplary embodiment of the present inventive concept.
Figure 6:
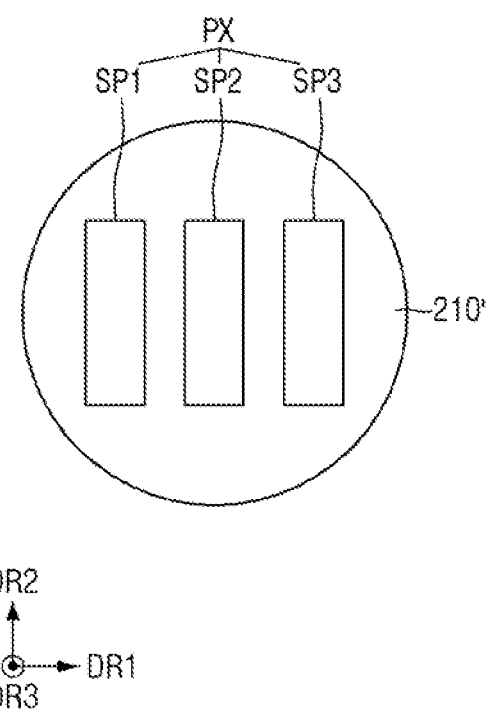
FIG. 6 is a plan view illustrating an example of a hemispherical lens of a lens array and pixels.

FIG. 5 is a perspective view of a display device 10 according to an exemplary embodiment of the present inventive concept. FIG. 6 is a plan view illustrating an example of a hemispherical lens 210' of a lens array 200' and pixels.

The present embodiment of FIGS. 5 and 6 is different from the embodiment of FIGS. 1 and 2 in that each lens 210' of the lens array 200' is a hemispherical lens, not a lenticular lens. In FIGS. 5 and 6, a redundant description of elements and features identical to those of the embodiment of FIGS. 1 and 2 may be omitted.

Referring to FIGS. 5 and 6, each of the lenses 210' may be a hemispherical lens or a semi-elliptical spherical lens. The lenses 210' may be arranged in the first direction DR1 and the second direction DR2.

Three subpixels SP1 through SP3 may be arranged in the first direction DR1 (e.g., the X-axis direction) in each of the lenses 210'. A first subpixel SP1 may be disposed adjacent to a first side of each lens 210'. A second subpixel SP2 may be disposed in the middle of each lens 210', and a third subpixel SP3 may be disposed adjacent to a second side of each lens 210'. For example, the second subpixel SP2 may be disposed between the first subpixel SP1 and the third subpixel SP3. For example, as illustrated in FIG. 6, the first side of each lens 210' may indicate a left side of the lens 210', and the second side of each lens 210' may indicate a right side of the lens 210'.

When each of the lenses 210' is a hemispherical lens, a pitch PIT1 of the lens 210' in the first direction DR1 (e.g., the X-axis direction) may be substantially equal to a pitch PIT2 of the lens 210' in the second direction DR2 (e.g., a Y-axis direction). When each of the lenses 210' is a semi-elliptical spherical lens, the pitch PIT1 of the lens 210' in the first direction DR1 (e.g., the X-axis direction) may be different from the pitch PIT2 of the lens 210' in the second direction DR2 (e.g., the Y-axis direction).

Each of the lenses 210' may provide view images displayed by the subpixels SP1 through SP3 to different view areas in front of the display device 10 as illustrated in FIG. 3, which therefore will not be described in detail since it was already described with reference to FIG. 3.

Figure 7:
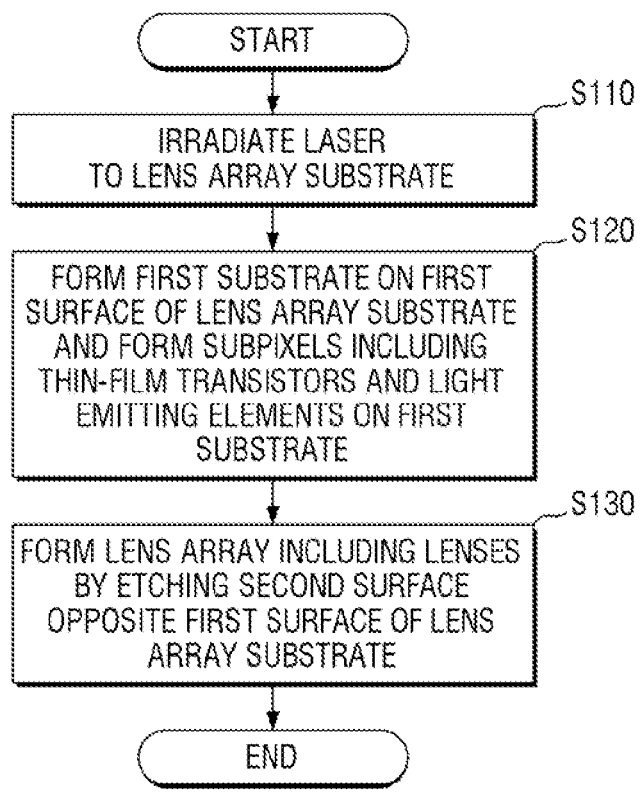
FIG. 7 is a flowchart illustrating a method of manufacturing a display device according to an exemplary embodiment of the present inventive concept.
Figure 8:
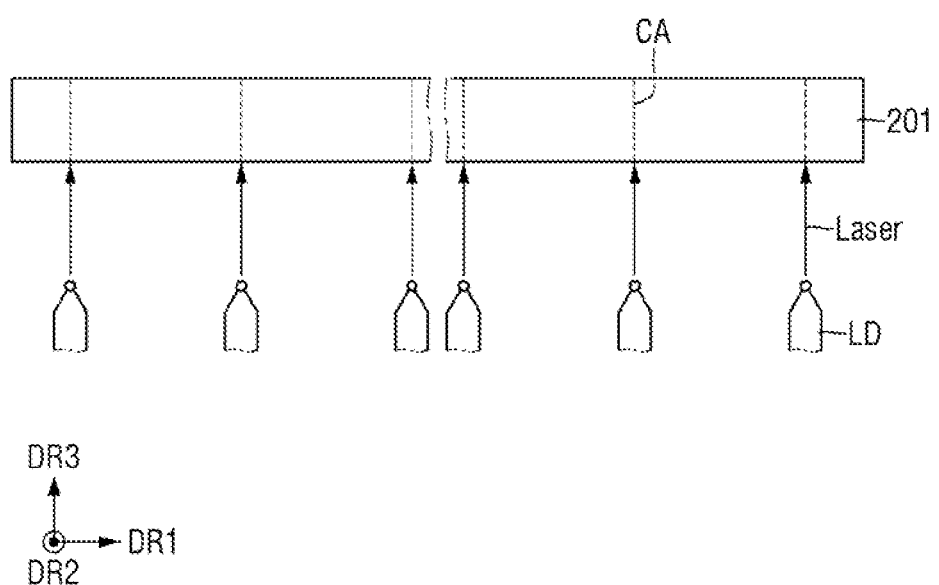
FIGS. 8, 9 and 10 are views illustrating the method of manufacturing the display device of FIG. 7.
Figure 9:
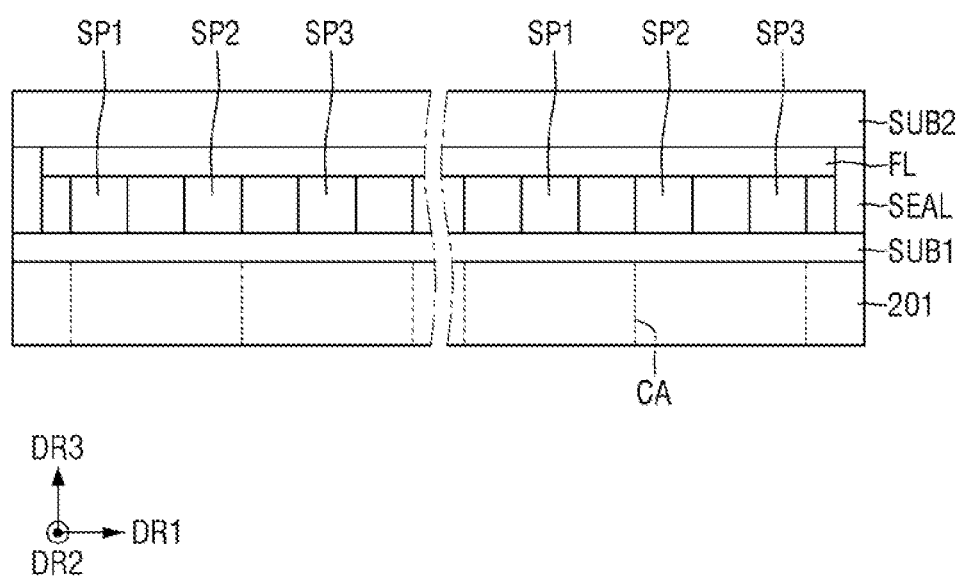
Figure 10:
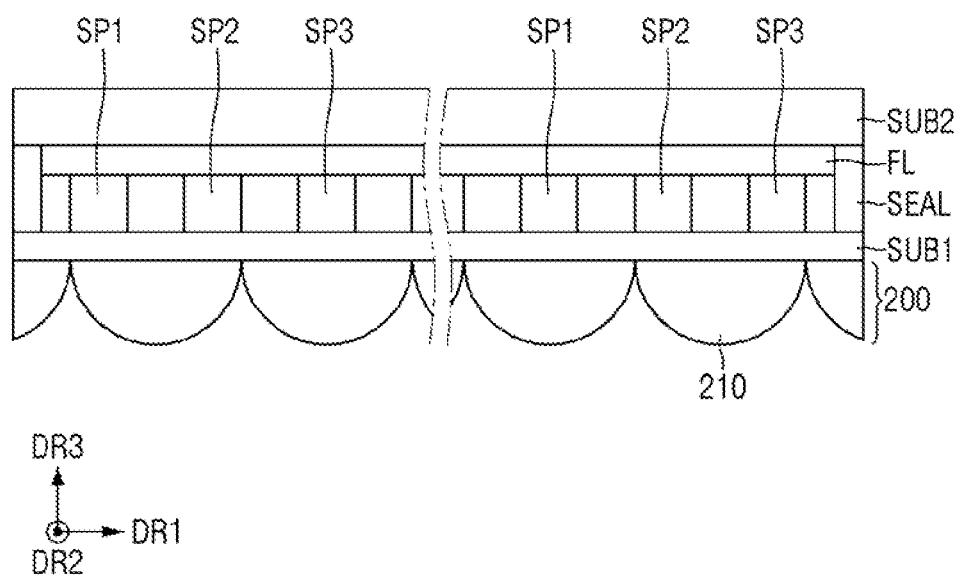

FIG. 7 is a flowchart illustrating a method of manufacturing a display device according to an exemplary embodiment of the present inventive concept. FIGS. 8 through 10 are views illustrating the method of manufacturing the display device of FIG. 7.

The method of manufacturing the display device 10 will now be described in detail with reference to FIGS. 7 through 10.

First, a laser device LD irradiates a laser to a predetermined position on a lens array substrate 201 (operation S110 of FIG. 7).

Referring to FIG. 8, the lens array substrate 201 may be a substrate for manufacturing a lens array 200 including a plurality of lenses 210. For example, the lens array substrate 201 may be made of glass.

The laser device LD may move to a predetermined position and irradiate a laser to the lens array substrate 201. For example, the laser irradiated by the laser device LD may be a femtosecond laser. The laser irradiation position of the laser device LD will be described later with reference to FIGS. 11 and 12.

When the laser device LD irradiates a laser to the lens array substrate 201, a bond between silicon (Si) and oxygen (O) of the glass may be broken, causing a change from a $SiO_2$ bond to a SiO bond. Therefore, physical properties of the glass in some areas of the lens array substrate 201, to which the laser has been irradiated by the laser device LD, may be different from physical properties of the glass in other areas, to which the laser has not been irradiated. In FIG. 8, areas in which the physical properties of the glass have been changed by the laser irradiated by the laser device ID are indicated by dotted lines CA for ease of description.

Second, a first substrate SUB1 is formed on a first surface of the lens array substrate 201, and subpixels SP1 through SP3 including thin-film transistors and light emitting elements are formed on the first substrate SUB1 (operation S120 of FIG. 7).

Referring to FIG. 9, an organic polymer material such as polyimide may be deposited on the first surface of the lens array substrate 201 to form the first substrate SUB1. In addition, not polyimide but another organic polymer material such as polyethylene, polycarbonate, polysulfone, polyacrylate, polystyrene, polyvinyl chloride, polyvinyl alcohol, polynorbornene, and/or polyester may be deposited on the first surface of the lens array substrate 201 to form the first substrate SUB1.

The first substrate SUB1 may be fixed to the first surface of the lens array substrate 201 without a separate adhesive member. The first substrate SL may directly contact the first surface of the lens array substrate 201.

The subpixels SP1 through SP3 may be formed on a surface of the first substrate SUB1. The subpixels SP1 through SP3 may respectively include emission areas EA1 through EA3 and emission drivers ED1 through ED3 as illustrated in FIG. 4. In each of the emission areas EA1 through EA3, a light emitting element including a first light emitting electrode 171, a light emitting layer 172 and a second light emitting electrode 173 may be disposed. At least one thin-film transistor ST may be disposed in each of the emission drivers ED1 through ED3.

Next, an encapsulation layer 190 is formed to encapsulate the subpixels SP1 through SP3 as illustrated in FIG. 4. Further, a filler FL is formed on the encapsulation layer 190, and the first substrate SUB1 and a second substrate SUB2 are bonded by a sealing material SEAL. For example, the sealing material SEAL may be a glass frit or a sealant.

Third, a second surface opposite the first surface of the lens array substrate 201 is etched to form the lens array 200 including the lenses 210 (operation S130 of FIG. 7).

Referring to FIG. 10, the lens array substrate 201, in some areas of which the physical properties of the glass have been changed by a laser irradiated from the laser device LD, is wet-etched using an etchant such as hydrogen fluoride (HF), The glass may have a SiO bond in areas where the physical properties of the glass have been changed by the laser, and may have a SiO2 bond in areas where the physical properties of the glass have not been changed because the laser was not irradiated thereto.

When the glass has the SiO bond, an etch rate by hydrogen fluoride for a predetermined period of time may be higher than when the glass has the SiO2 bond. Here, the etch rate of the glass may be lowered as the distance from the areas having the SiO bond increases. Each area of the lens array substrate 201 irradiated with a laser by the laser device LD may be a boundary between the lenses 210. As illustrated in FIG. 10, the lens array 200 including the lenses 210 whose cross-sections curve outwards from the first substrate SUB1 may be formed from the lens array substrate 201.

As illustrated in FIGS. 7 through 10, to form the lenses 210 using the lens array substrate 201, when a laser is irradiated to a predetermined position on the lens array substrate 201 and then the lens array substrate 201 is wet-etched using an etchant such as hydrogen fluoride, the lens array 200 including the lenses 210 may be formed. For example, the lens array 200 including the lenses 210 may be formed by applying laser induced deep etching (LIDE) technology to the lens array substrate 201. Therefore, the other surface of the first substrate SUB1 can be fixed to the lenses 210 without a separate adhesive member. In addition, there is no need to align and attach the lens array 200 to the first substrate SUB1.

Furthermore, since the lens array substrate 201 supports a display panel 100 during a manufacturing process, there is no need for a separate carder substrate or support substrate.

In FIGS. 7 through 10, after a laser is irradiated to the lens array substrate 201, the first substrate SUB1 and the subpixels SP1 through SP3 including the thin-film transistors and the light emitting elements are formed on the first surface of the lens array substrate 201, and then the lens array substrate 201 is wet-etched. However, the present inventive concept is not limited thereto. For example, after the subpixels SP1 through SP3 including the thin-film transistors and the light emitting elements are formed on the first surface of the lens array substrate 201, a laser may be irradiated to the lens array substrate 201, and then the lens array substrate 201 may be wet-etched.

Figure 11:
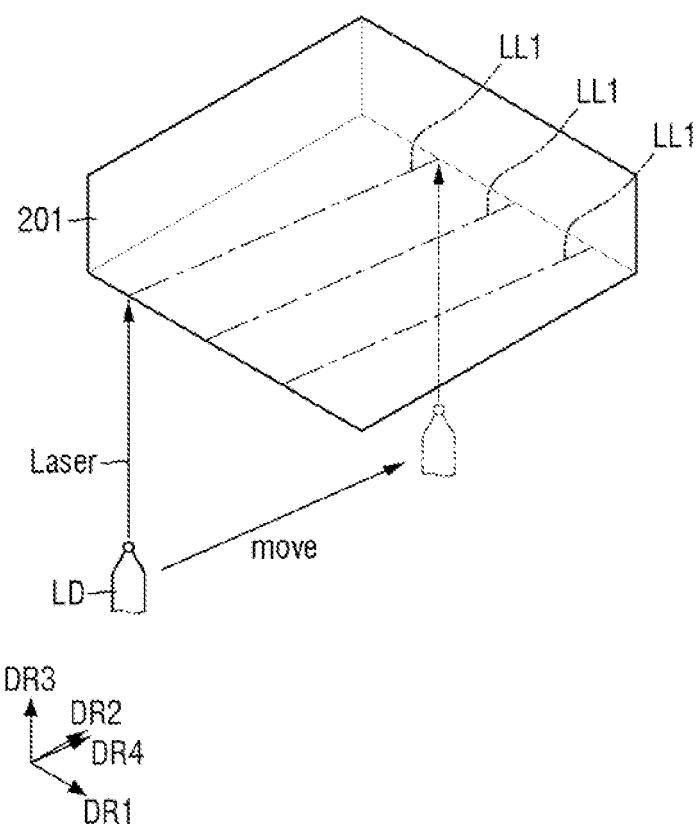
FIG. 11 illustrates an example laser irradiation position when a lenticular lens array is formed on a surface of a lens array substrate.

FIG. 11 illustrates an example laser irradiation position when a lenticular lens array is formed on a surface of a lens array substrate 201.

Referring to FIG. 11, when each lens 210 to be formed using the lens array substrate 201 is a lenticular lens, a laser device LD may irradiate a laser to the lens array substrate 201 along a plurality of first lens lines LL1. Each first lens line LL1 may be a boundary between the lenses 210 to be formed using the lens array substrate 201. For example, each first lens line LL1 may be formed between adjacent lenses 210. Since the boundary between the lenses 210, to be formed in the lens array substrate 201, extends in the fourth direction DR4, each first lens line LL1 may extend in the fourth direction DR4. In addition, since the lenses 210, to be formed in the lens array substrate 201, are arranged in the fifth direction DR5 crossing the first direction DR1 (see, e.g., FIG. 2), a gap between adjacent first lens lines LL1 in the fifth direction DR5 may be substantially equal to a pitch PIT of each lens 210.

Figure 12:
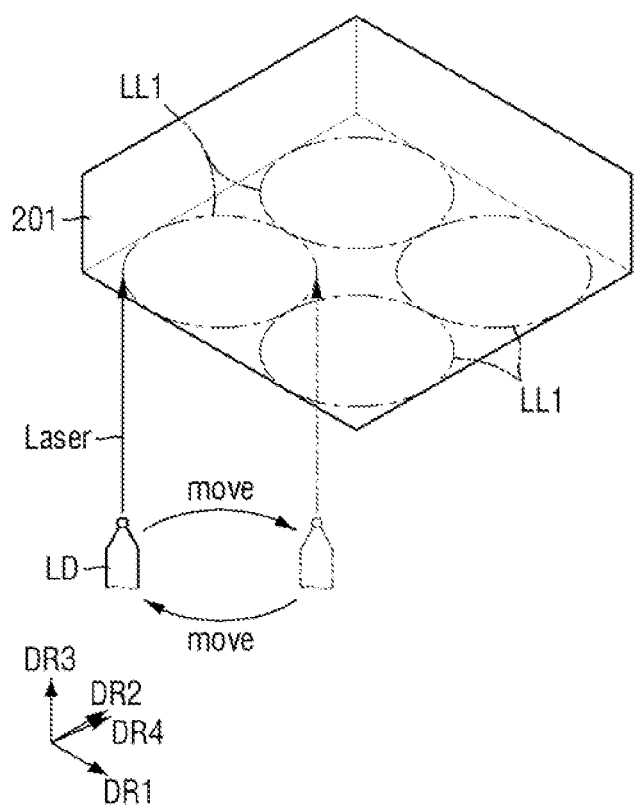
FIG. 12 illustrates an example laser irradiation position when a hemispherical lens array is formed on a surface of a lens array substrate.

FIG. 12 illustrates an example laser irradiation position when a hemispherical lens array is formed on a surface of a lens array substrate 201.

Referring to FIG. 12, when each lens 210 to be formed using the lens array substrate 201 is a hemispherical lens or a semi-elliptical spherical lens, a laser device LD may irradiate a laser to the lens array substrate 201 along each first lens line LL1. Each first lens line LL1 may be a rim or a circumference of a lens 210 to be formed in the lens array substrate 201. Therefore, when the lenses 210 to be formed using the lens array substrate 201 are hemispherical lenses, the first lens lines LL1 may have a circular planar shape. In addition, when the lenses 210 to be formed using the lens array substrate 201 are semi-elliptical spherical lenses, the first lens lines LL1 may have an elliptical planar shape.

In a display device and a method of manufacturing the same according to an exemplary embodiment of the present inventive concept, to form lenses using a lens array substrate, a laser is irradiated to a predetermined position on the lens array substrate by using a laser device. Then, the lens array substrate is wet-etched using an etchant such as hydrogen fluoride to form a lens array including the lenses. Therefore, the lenses can be fixed to a display panel without a separate adhesive member. In addition, there is no need to align and attach the lens array to the display panel.

Furthermore, in the display device and the method of manufacturing the same according to an exemplary embodiment of the present inventive concept, the lens array substrate may support the display panel during a manufacturing process. Therefore, there is no need for a separate carrier substrate or support substrate.

While the present inventive concept has been described with reference to the exemplary embodiments thereof, it will be understood by those of ordinary skill in the art that various changes in form and detail may be made thereto without departing from the spirit and scope of the present inventive concept.

What is claimed is:

1. A display device comprising:
    a first substrate;
    thin-film transistors disposed on a first surface of the first substrate;
    light emitting elements connected to corresponding ones of the thin-film transistors, respectively, and disposed on the thin-film transistors; and
    a lens array comprising lenses disposed on a second surface of the first substrate opposite to the first surface of the first substrate,
    wherein the light emitting elements emit light toward the first substrate,
    wherein the thin-film transistors are disposed between the light emitting elements and the first substrate, and
    wherein a lens of the lenses overlaps N (N is an integer greater than 1) light emitting elements among the light emitting elements.

2. The display device of claim 1, wherein the lens array contacts the second surface of the first substrate.

3. The display device of claim 2, wherein the first substrate includes a polymer resin.

4. The display device of claim 1, wherein the lens array includes glass.

5. The display device of claim 1, wherein each of the light emitting elements comprises:
    a first electrode connected to a thin-film transistor of the thin-film transistors;
    a light emitting layer disposed on the first electrode; and
    a second electrode disposed on the light emitting layer,
    wherein the first electrode includes a conductive material that transmits light, and the second electrode includes a conductive material that reflects light.

6. The display device of claim 5, further comprising a second substrate disposed on the second electrode.

7. The display device of claim 1, wherein each of the lenses has a half-cylindrical shape or a hemispherical shape.

8. The display device of claim 1, wherein each of the lenses curves outwards from the second surface of the first substrate.

* * * * *